US007019574B2

(12) United States Patent
Schrödinger

(10) Patent No.: US 7,019,574 B2
(45) Date of Patent: Mar. 28, 2006

(54) CIRCUIT AND METHOD FOR CORRECTION OF THE DUTY CYCLE VALUE OF A DIGITAL DATA SIGNAL

(76) Inventor: Karl Schrödinger, Setheweg 12, 14089 Berlin (DE)

( * ) Notice: Subject to any disclaimer, the term of this patent is extended or adjusted under 35 U.S.C. 154(b) by 0 days.

(21) Appl. No.: 10/767,971

(22) Filed: Jan. 29, 2004

(65) Prior Publication Data

US 2005/0168256 A1 Aug. 4, 2005

(51) Int. Cl.
*H03K 3/017* (2006.01)

(52) U.S. Cl. ...................................... 327/175; 327/176

(58) Field of Classification Search ......... 327/172–176
See application file for complete search history.

(56) References Cited

U.S. PATENT DOCUMENTS

| | | | | |
|---|---|---|---|---|
| 5,600,272 | A * | 2/1997 | Rogers | 327/157 |
| 6,038,266 | A * | 3/2000 | Lee et al. | 375/317 |
| 6,040,726 | A * | 3/2000 | Martin | 327/175 |
| 6,055,287 | A * | 4/2000 | McEwan | 375/376 |
| 6,157,234 | A * | 12/2000 | Yamaguchi | 327/175 |
| 6,404,292 | B1 * | 6/2002 | Lautzenhiser | 331/17 |
| 6,426,660 | B1 * | 7/2002 | Ho et al. | 327/175 |
| 6,459,314 | B1 * | 10/2002 | Kim | 327/161 |
| 6,518,809 | B1 * | 2/2003 | Kotra | 327/175 |
| 6,680,637 | B1 * | 1/2004 | Seo | 327/175 |
| 6,850,581 | B1 * | 2/2005 | Tomofuji et al. | 375/355 |
| 2004/0075462 | A1 * | 4/2004 | Kizer et al. | 326/29 |

FOREIGN PATENT DOCUMENTS

JP 63-13519 * 1/1988

* cited by examiner

*Primary Examiner*—Tuan T. Lam
(74) *Attorney, Agent, or Firm*—Workman Nydegger

(57) ABSTRACT

According to the invention, a duty cycle correction device is disclosed. The duty cycle correction device corrects the duty cycle value of a data signal as a function of a digital control signal that is applied to a control input of the duty cycle correction device, and forms a corrected data signal at a signal output. The circuit has a digital duty cycle detector that is connected to the signal output and to the control input of the duty cycle correction device. The circuit determines the actual duty cycle value of the corrected data signal, and produces the digital control signal for the duty cycle correction device such that the discrepancy between the respective actual duty cycle value and a predetermined duty cycle value is a minimum. The duty cycle detector contains a digital integrator for forming the control signal.

16 Claims, 4 Drawing Sheets

| counter latch L | digital valve | | | | ΔΦ |
|---|---|---|---|---|---|
| 8 | 1 | 0 | 0 | 0 | $(1/2-8/16)\ t_{BIT}$ |
| ... | | | | | |
| 2 | 0 | 0 | 1 | 0 | $(1/2-2/16)\ t_{BIT}$ |
| 1 | 0 | 0 | 0 | 1 | $(1/2-1/16)\ t_{BIT}$ |
| 0 | 0 | 0 | 0 | 0 | $(1/2)\ t_{BIT}$ |
| 15=-1 | 1 | 1 | 1 | 1 | $(1/2+1/16)\ t_{BIT}$ |
| 14=-2 | 1 | 1 | 1 | 0 | $(1/2+2/16)\ t_{BIT}$ |
| ... | | | | | |
| 9=-7 | 1 | 0 | 0 | 1 | $(1/2+7/16)\ t_{BIT}$ |

CIRCUIT AND METHOD FOR CORRECTION OF THE DUTY CYCLE VALUE OF A DIGITAL DATA SIGNAL

FIELD OF THE INVENTION

The invention relates to a circuit and to a method for correction of the duty cycle value Dc of a digital data signal. In the following text, the expression duty cycle value Dc means the ratio between the bit length $t_{Bit}$ ("high") of a "high" signal and the bit length $t_{Bit}$ ("low") of a "low" signal. Thus:

$$Dc = \frac{t_{Bit}(\text{high})}{t_{Bit}(\text{high}) + t_{Bit}(\text{low})}$$

BACKGROUND OF THE INVENTION

A circuit for correction of the duty cycle value of a digital data signal is known from the document "CMOS Digital Duty Cycle Correction Circuit for Multi-Phase Clock" (Y. C. Jang, S. J. Bae, H. J. Park; "Electronics Letters" 18 Sep. 2003, Vol. 39, No. 19, pages 1383 to 1384). The already known circuit has a duty cycle correction device with a rising edge detector (rising edge generator) and a falling edge detector (falling edge generator). The falling edge detector is arranged upstream of a controllable phase shifter, which can be driven by means of a control signal. The controllable phase shifter is driven by a duty cycle detector, which measures the duty cycle value of the data signal at the signal output of the duty cycle correction device and transmits a control signal to the controllable phase shifter such that the data signal at the signal output of the duty cycle correction device reaches a predetermined duty cycle value.

The duty cycle detector in the already known circuit has two current integrators which are connected in parallel. A comparator is connected to the output of the two current integrators, and is followed by a digital counter. The two current integrators are analogue components.

OBJECT OF THE INVENTION

Against the background of the already known prior art, one object of the invention is to specify a circuit and a method for correction of the duty cycle value of a digital data signal. The circuit and the method are intended to be insensitive to interference and to operate reliably with very low signal levels.

SUMMARY OF THE INVENTION

The stated object is achieved according to the invention by a circuit which has a duty cycle correction device and a duty cycle detector. The duty cycle detector uses a control signal to drive the duty cycle correction device such that the digital data signal at the signal output of the duty cycle correction device reaches a predetermined duty cycle value. According to the invention, the duty cycle detector has a digital integrator in order to form the control signal.

One major advantage of the circuit according to the invention is that the use of the digital integrator means that it is particularly insensitive to interference. Even very low signal levels can thus be processed reliably using the circuit according to the invention. The particularly high degree of insensitivity to interference is achieved, according to the invention, in that the analogue integrators which are already known in conjunction with the correction of duty cycle values, by way of example such as those which are included in the circuit in the initially cited document, are replaced by a digital integrator which allows complete digital processing of the data signal.

A further major advantage of the circuit according to the invention is that the use of the digital integrator allows the pulse lengths of the digital data signal to be varied widely without the correction of the duty cycle value being adversely affected by this.

A third major advantage of the circuit according to the invention is that the pulse lengths of the pulses of the data signal need not be averaged before the correction of the duty cycle value; this is because even data signals with highly fluctuating pulse lengths can be processed as a result of the use of the digital integrator.

A fourth major advantage of the circuit according to the invention is that virtually any desired duty cycle values can be set. There is no restriction to a duty cycle value of essentially 50%.

One advantageous refinement of the invention provides for the duty cycle detector to have a digital averaging circuit which determines the times at which the respective output signal from the digital integrator is used to form and update the control signal. The averaging circuit on the one hand averages the sampling errors that are caused by the at least one digital integrator, and on the other hand averages the variable data bit lengths of the digital data signal, thus considerably reducing measurement and control errors in the correction of the duty cycle value.

The digital averaging circuit preferably has a signal edge counter, which counts the signal edges of the corrected data signal and triggers the production of the digital control signal as a function of its count, by means of a trigger signal. The signal edge counter thus determines the time interval over which the digital integrator should integrate.

The signal edge counter produces the trigger signal in a particularly simple and thus advantageous manner whenever it has once again counted a predetermined number of newly occurring signal edges—that is to say those which have occurred newly since the respective last trigger time—after a respective previous trigger process.

The digital averaging circuit preferably has a latch module, which is connected on the input side to an output of the digital integrator and passes on the output signal on the digital integrator as a control signal to the duty cycle correction device when a trigger signal from the signal edge counter is applied to a control connection of the latch module. The latch module thus operates as a type of store, which in each case passes on the output signal from the digital integrator whenever the signal edge counter has reached a corresponding count.

The digital integrator preferably has a clock generator and a step-up and step-down counter which is connected to the clock generator. The step-up and step-down counter counts up or down when the corrected data signal is at a "high" level, and counts in the opposite direction when the corrected data signal is at a "low" level. This means that, if it counts up in the case of a "high" level, it counts down in the case of a "low" level; instead of this, it may also count up in the case of a "low" level and count down in the case of a "high" level.

The output side of the step-up and step-down counter is preferably connected to the already mentioned digital averaging circuit, which determines the times at which the respective output signal from the digital integrator is used to form and update the control signal.

The output side of the step-up and step-down counter is preferably connected to an input of the latch module in the digital averaging circuit, with the latch module receiving the respective count of the step-up and step-down counter in order to form and update the control signal, and emitting this at its output when a trigger signal is applied to a control connection of the latch module.

It is also regarded as being advantageous for the duty cycle correction device to have a rising edge detector and a falling edge detector, whose output signals are used to form the corrected data signal.

The rising edge detector and the falling edge detector are preferably each preceded by a phase shifter, to whose input side the data signal is applied. At least one of the two phase shifters, preferably the phase shifter which is arranged upstream of the falling edge detector, is designed such that it can be driven by means of a control connection, thus allowing an external drive.

The phase shifter which can be driven is preferably driven by the latch module in the digital integrator.

It is also regarded as advantageous for an RS (reset/set) latch module to be connected to the output of the rising edge detector and to the output of the falling edge detector, forming the corrected data signal with the output signals from the rising edge detector and from the falling edge detector.

One or more buffer modules or amplifier modules may be electrically arranged between the signal output of the duty cycle correction device and the output of the RS latch module, through which the corrected data signal is passed before it is emitted at the signal output of the duty cycle correction device.

The invention also relates to a method for duty cycle correction of a digital data signal.

With regard to a method such as this, the object as mentioned initially is achieved according to the invention is that two auxiliary signals with a predetermined phase shift with respect to one another are formed from the data signal. The two auxiliary signals are used to obtain a data signal whose duty cycle value has been corrected, in that the discrepancy between the duty cycle value of the corrected data signal and a preset value is determined by means of a duty cycle detector, and the phase shift between the auxiliary signals is set such that the discrepancy between the duty cycle value and the preset value is a minimum. The duty cycle detector carries out digital integration according to the invention for this purpose.

With regard to the advantages of the method according to the invention, reference should be made to the above statements in conjunction with the circuit according to the invention, since the advantages of the circuit according to the invention essentially correspond to the advantages of the method according to the invention.

With regard to advantageous refinements of the method according to the invention, reference should be made to the claims which are dependent on the other independent method claim.

BRIEF DESCRIPTION OF THE DRAWINGS

In order to explain the invention.

DETAILED DESCRIPTION OF THE INVENTION

Figure 1:
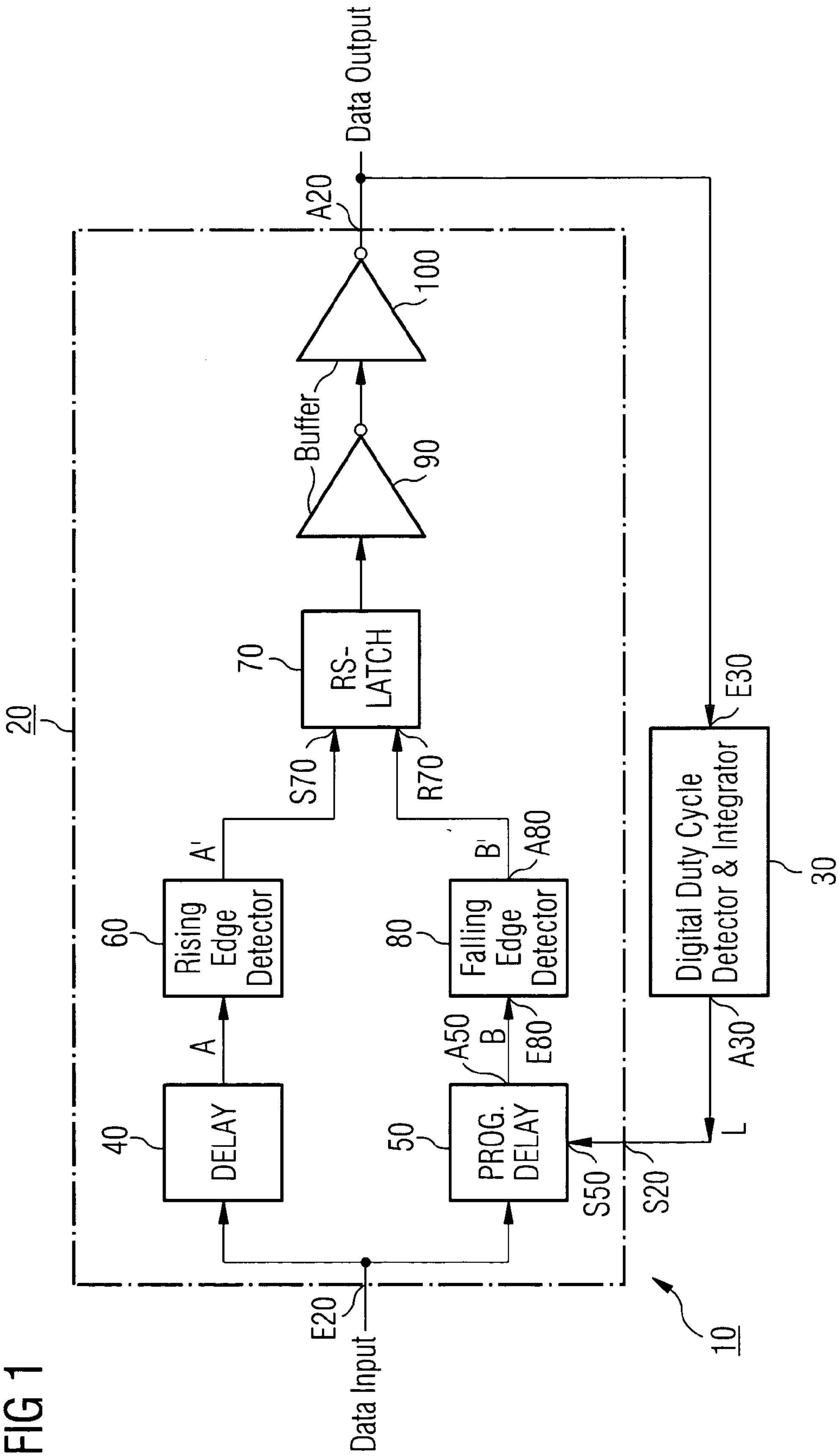
FIG. 1 shows an exemplary embodiment of a circuit according to the invention for correction of the duty cycle value of a digital data signal, by means of which circuit the method according to the invention can also be carried out.

FIG. 1 shows a circuit for correction of the duty cycle value of a digital data signal "data input". This shows a duty cycle correction device 20, to whose signal input E20 the digital data signal "data input" is applied.

A corrected data signal with a corrected duty cycle value is produced by the duty cycle correction device 20 at a signal output A20 from it; the corrected data signal is annotated by the reference symbol "data output" in FIG. 1.

One input E30 of a digital duty cycle detector 30 is connected to the signal output A20 of the duty cycle correction device 20. One output A30 of the duty cycle detector 30 is connected to a control input S20 of the duty cycle correction device 20, and drives it via a control signal L.

The duty cycle correction device 20 has two phase shifters 40 and 50 on the input side, to both of whose input sides the data signal "data input" is applied. One phase shifter 40 produces a fixed phase shift of, for example, $t_{Bit}/2$.

The other phase shifter 50 is a controllable phase shifter, whose phase shift Δφ is set by the control signal L from the digital duty cycle detector 30 at the control input S50.

The first phase shifter 40 is followed by a rising edge detector 60, whose output side is in turn connected to a set input S70 of an RS latch module 70.

A reset input R70 of the RS latch module 70 is connected to an output A80 of a falling edge detector 80. The falling edge detector 80 is connected to an input E80 and to an output A50 of the controllable phase shifter 50.

One output A70 of the RS latch module 70 is connected to the signal output A20 via two inverters 90 and 100, which act as buffer elements and amplifiers.

Figure 2:
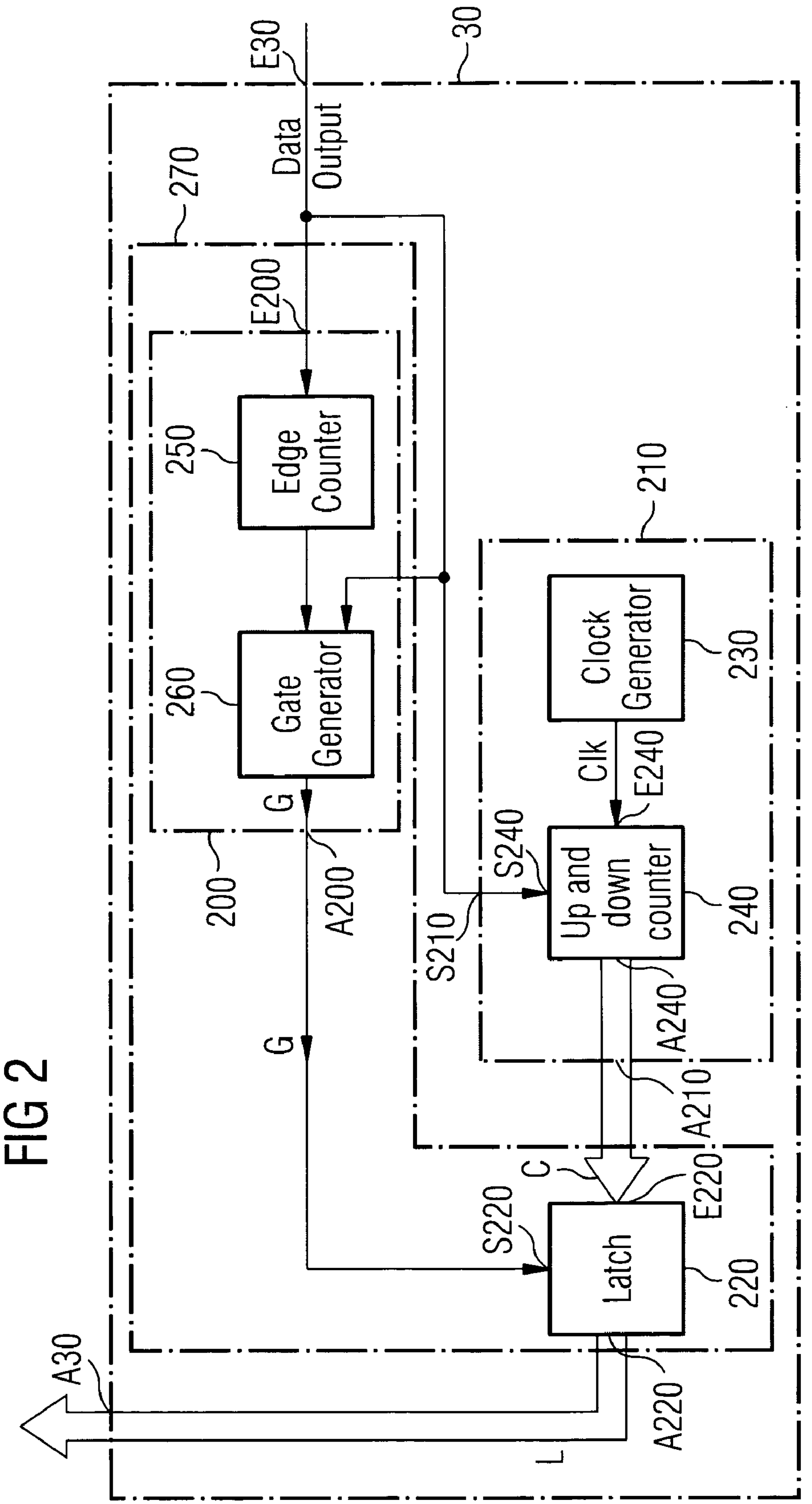
FIG. 2 shows an exemplary embodiment of a digital duty cycle detector for the circuit as shown in FIG. 1.

FIG. 2 shows the configuration of a digital duty cycle detector 30. This shows the input E30 to which the corrected data signal "data output" from the digital duty cycle detector 30 is applied.

One input E200 of a digital signal edge counter 200 is connected to the input E30 of the duty cycle detector 30. Furthermore, the input E30 of the digital duty cycle detector 30 is connected to a control connection S210 of a digital integrator 210.

One output A210 of the digital integrator 210 is connected to one input E220 of a latch module 220, whose output A220 forms the output A30 of the duty cycle detector 30 as shown in FIG. 1. A control connection S220 of the latch module 220 is connected to an output A200 of the signal edge counter 200 and is triggered by it via a trigger signal G.

As can be seen from FIG. 2, the digital integrator 210 comprises a clock generator 230, whose output side is connected to an input E240 of a step-up and step-down counter 240. The step-up and step-down counter 240 has a control connection S240 which forms the control connection S210 of the digital integrator 210 and to which the corrected data signal "data output" is applied. The output A240 of the step-up and step-down counter 240 forms the output A210 of the digital integrator.

As can also be seen from FIG. 2, the signal edge counter 200 has an edge counter 250 and a downstream gate generator 260. The trigger signal G for the latch module 220 is formed at the output of the gate generator 260.

The latch module 220 and the signal edge counter 200 which is formed by the edge counter 250 and the gate generator 260 form a digital averaging circuit 270, which interacts with the digital integrator 210.

Figure 3:
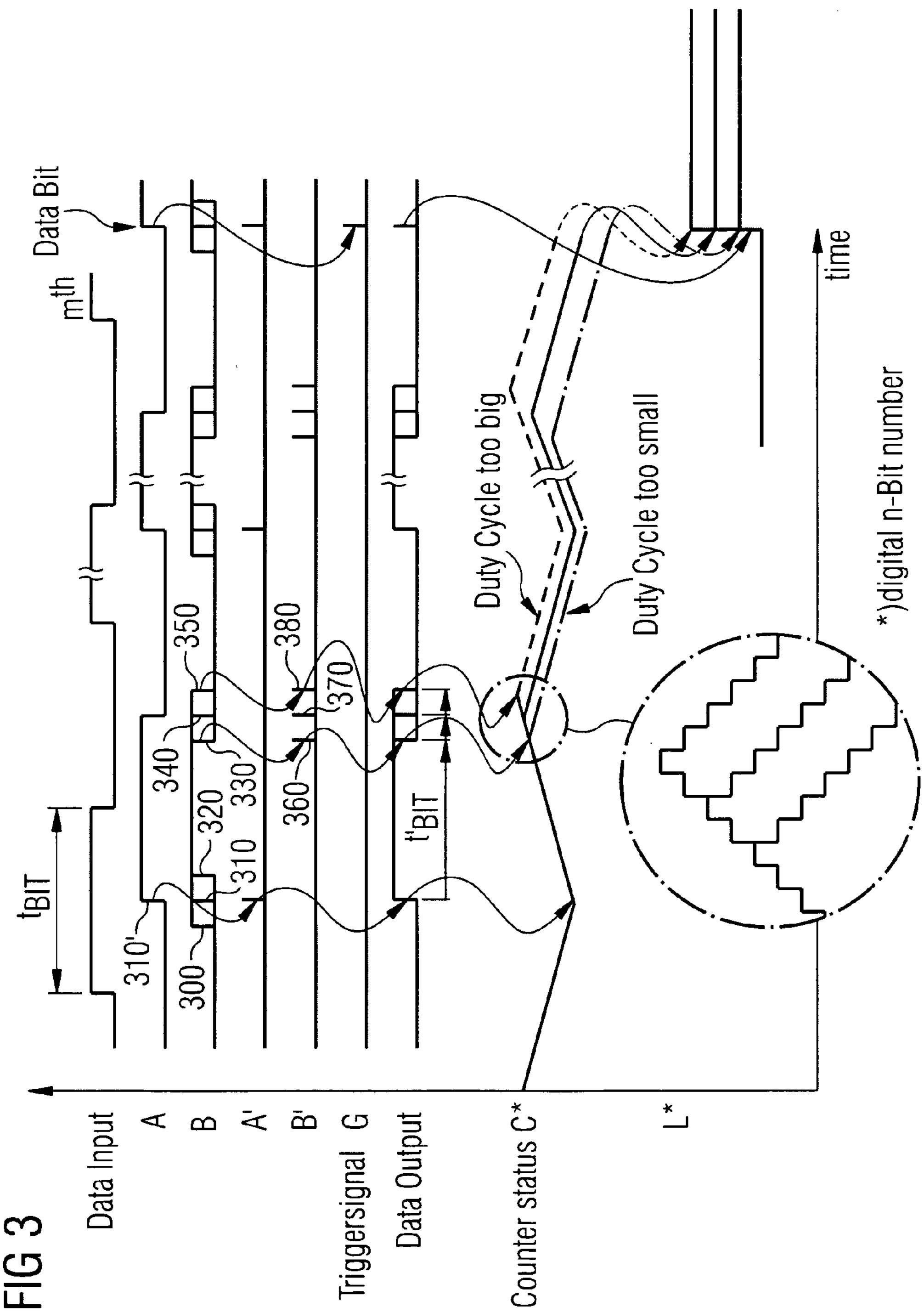
FIG. 3 shows the method of operation of the circuit as shown in FIG. 1 and of the digital duty cycle detector as shown in FIG. 2, on the basis of signal waveforms.

The method of operation of the circuit for correction of the duty cycle value of the digital data signal "data input" will now be explained in the following text with reference to the data signals which occur in the circuit, and which are shown in FIG. 3.

FIG. 3 shows the time waveform of the data signal "data input". As can be seen the "high" level of the data signal "data input" has a bit length of "$t_{Bit}$".

The data signal "data input" is fed into the duty cycle correction device 20 at the signal input E20 and is passed to the two phase shifters 40 and 50 which produce a phase shift. Since one phase shift 40 is a phase shifter with a fixed phase shift, the signal A is produced at the output of the phase shifter 40 with a constant phase shift with respect to the data signal.

The signal B is produced at the output of the controllable phase shifter 50. FIG. 3 shows three rising signal edges 300, 310 and 320 for the signal B.

The first rising edge 300 in this case shows the rising signal edge for the situation where the control signal L has produced a phase shift in the phase shifter 50 which is less than the phase shift in the phase shifter 40.

The central rising edge 310 illustrates the rising edge for the situation where the control signal L has set a phase shift in the phase shifter 50 which corresponds to the phase shift in the phase shifter 40. In a situation such as this, the rising signal edge 310 of the signal B and the rising edge 310' of the signal A thus occur at the same time.

The reference symbol 320 symbolizes the rising signal edge of the signal B for the situation where the control signal L has produced a phase shift in the phase shifter 50 which is greater than the phase shift in the phase shifter 40.

In a corresponding manner, the reference symbols 330, 340 and 350 symbolize the associated falling signal edge of the signal B, respectively for the smaller, the medium and the higher phase shift of the phase shifter 50.

The output signal A which is produced by the first phase shifter 40 is passed to the rising edge detector 60, which uses it to form a signal A'. The signal A' is a pulse which occurs at the time at which the signal A rises.

The output signal B which is produced by the further phase shifter 50 is passed to the falling edge detector 80, which thus forms a signal B'. The signal B' is likewise a pulsed signal and occurs whenever the signal B at the input E80 of the falling edge detector 80 has a falling signal edge. FIG. 3 shows three signal pulses 360, 370 and 380 relating to this. The pulse 360 relates to the falling signal edge 330 of the signal B; the central pulse 370 relates to the falling edge 340 of the signal B, and the pulse 380 relates to the falling edge 350 of the signal B. This association is illustrated in FIG. 3 by means of curved or sinusoidal arrows.

The two signals A' and B' from the rising edge detector 60 and from the falling edge detector 80 are passed to the RS latch module 70, which thus forms the corrected data signal "data output". Specifically, a "high" signal is produced at the output A70 of the RS latch module 70 when a signal pulse is applied to the set input S70 of the RS latch module 70. The corrected data signal "data output" is switched back to a "low" level as soon as the signal B' has its pulse 360, 370 or 380 at the reset input R70.

In summary, it can thus be stated that the bit length $t'_{Bit}$ of the "high" level of the corrected data signal "data output" depends on the phase shift which is set at the control connection S50 of the controllable phase shifter 50.

The drive for the further phase shifter 50 at the control connection S50 is produced by means of the duty cycle detector 30 as follows: the corrected data signal "data output" is fed into the digital averaging circuit 270 at the input E30 of the duty cycle detector 30, and is fed into the digital integrator 210 at a control connection S210. The clock generator 230 in the digital integrator 210 produces a clock signal Clk whose clock frequency is higher than the data rate of the data signal "data input" and of the corrected data signal "data output". As will be explained in the following text, this ensures over sampling of the data signal "data output".

The clock frequency $f_{clk}$ of the clock signal Clk is advantageously a multiple of the data rate of the data signal "data output", that is to say, $$f_{clk}=N*1/t_{Bit}$$

where $t_{Bit}$ indicates the bit length of the data signal, data input or data output. N is any desired real number greater than one. For example, N may be an integer.

The step-up and step-down counter 240 which is connected downstream from the clock generator 230 now counts the clock pulses of the clock signal Clk from the clock generator 230. In this case, the counting direction of the step-up and step-down counter 240 is governed by the corrected data signal "data output" which is applied to the control connection S210 of the digital duty cycle detector 210 and thus to the control connection S240 of the step-up and step-down counter 240. When the corrected data signal "data output" is at a "high" level, then, for example, the step-up and step-down counter counts upwards. When, on the other hand, the corrected data signal "data output" is at a "low" level, then it counts downwards in a corresponding manner.

Alternatively, the counting direction of the step-up and step-down counter 240 may also be precisely reversed: this means that it counts downwards when the corrected data signal "data output" is at a "high" level and counts upwards when the corrected data signal "data output" is at a "low" level.

Since the counting direction of the step-up and step-down counter 240 changes as a function of the level of the corrected data signal "data output", this results in a type of integration whose integration value indicates the duty cycle value of the corrected data signal "data output": specifically, if the bit length $t_{Bit}$ ("high") at a "high" level lasts for precisely the same time as the bit length $t_{Bit}$ ("low") at a "low" level, then a count of zero will appear at the output A240 of the step-up and step-down counter 240 since it has been "counting upwards" for precisely the same time that it has been "counting downwards". A zero is therefore produced at the output of the step-up and step-down counter 240 when the duty cycle value is 50%.

If the duty cycle value of the corrected data signal data output is shifted in the direction of higher or lower values, then a number other than zero will appear at the output A240 of the step-up and step-down counter 240.

If, as we assume by way of example in the following text, the counter counts upwards when the corrected data signal "data output" is at a "high" level and counts downwards when the corrected data signal "data output" is at a "low" level, then the counter will count downwards for "longer" than it counts upwards when the duty cycle value Dc is below 50% so that a negative count will be formed at the output A240 of the step-up and step-down counter 240.

As already mentioned initially, the duty cycle value Dc is calculated as follows:

$$Dc = \frac{t_{Bit}(\text{high})}{t_{Bit}(\text{high}) + t_{Bit}(\text{low})}$$

If, on the other hand, the duty cycle value exceeds a value of 50% then the counter counts upwards for "longer" than it counts downwards, so that a positive count will be formed at the output A240 of the step-up and step-down counter 240.

In summary, it can therefore be stated that the count at the output A240 of the step-up and step-down counter 240 reflects the duty cycle value of the data signal "data output".

The count C at the output A240 of the step-up and step-down counter 240 is annotated "counter C" in FIG. 3. As can be seen, the count fluctuates and increases when the data signal "data output" is at a "high" level, and decreases when the corrected data signal "data output" is at a "low" level.

FIG. 3 in this case uses a solid line to show the situation where the duty cycle value is exactly 50%. The dashed line, that is to say the upper line, indicates the profile of the count C for the situation where the duty cycle value is greater than 50%, or is too high. The dashed-dotted line, that is to say the lower line, indicates the count C for the situation where the duty cycle value is less than 50%.

The respective count C is not now passed directly to the control connection S50 of the phase shifter 50 but, instead of this, is fed into the digital averaging circuit 270. Specifically, the count C is passed to the latch module 220, which always passes on the count C as the control signal L to the duty cycle correction device 20 at those times at which a trigger signal G is applied to the control connection S220 of the latch module 220. The trigger signal G is produced by the gate generator 260 of the signal edge counter 200 whenever the edge counter 250 in the signal edge counter 200 has detected a predetermined number of edge changes or bit changes.

This can be seen in FIG. 3, since FIG. 3 also shows the trigger signal G. As can be seen, when the trigger signal G occurs the respective count C is passed from the step-up and step-down counter 240 to the output A220 of the latch module 220, thus forming the control signal L which reflects the count C.

FIG. 3 likewise shows the control signal L. As can be seen, the magnitude of the control signal L depends on the respective count C of the step-up and step-down counter 240.

In summary, it can thus be stated that the clock generator 230 and the step-up and step-down counter 240 form a digital integrator, which digitally integrates the corrected data signal "data output". Since the clock frequency of the clock signal Clk is a multiple of the data rate of the data signal "data output", this results in over sampling, thus reducing the sampling error in the digital integration process. Specifically, the time sampling error $T_{ABT}$ is:

$$T_{ABT} = \frac{1}{f_{Clk}},$$

so that the sampling error decreases as the clock frequency increases.

Furthermore, the digital averaging circuit 270 considers a large number of data bits in the course of the digital integration of the digital integrator 210. Depending on the coding of the data signal "data input" it is possible for a large number of "high" or "low" levels to be transmitted successively. In order to prevent a series of identical signal levels such as these leading to an incorrect integration result in the digital integrator 210, the digital averaging circuit 270 is provided, which carries out a temporary averaging process for a long period of time. Specifically, the integration is always carried out in the digital integrator 210 for as long as this is stipulated by the signal edge counter 200. The signal edge counter 200 thus ensures that a predetermined number of different signal levels are always included in the digital integration. The signal edge counter 200 the digital averaging circuit 270 thus impose a "minimum integration time".

In order now to ensure a suitable phase shift value is set for the further phase shifter 50, the duty cycle detector 30 has to form a suitable feedback loop. This requires the duty cycle detector 30 to have a "negative" characteristic, or to provide negative feedback in the control loop.

Figures 4, 5:
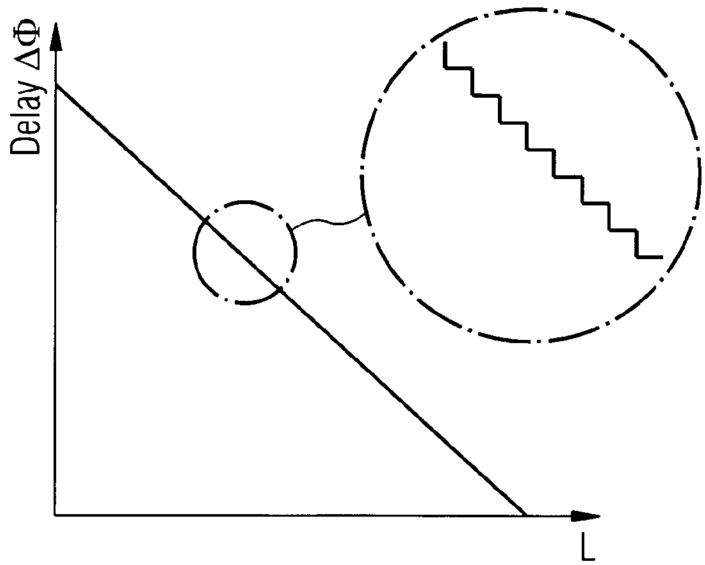
FIG. 4 shows a characteristic for driving a controllable phase shifter in the circuit as shown in FIG. 1.
FIG. 5 shows a table which, by way of example, shows digitally coded control signals for driving the phase shifter as shown in FIG. 1.

FIG. 4 shows a negative characteristic or negative feedback such as this. As can be seen from FIG. 4, the phase shift Δϕ ("delay") which is produced by the further phase shifter 50 is a function of the control signal L.

The control signal L is in this case defined by a digital number which is represented by a predetermined number of bits. If the step-up and step-down counter 240 is a four-bit counter, then, by way of example, the control signal L may be coded as shown in the table in FIG. 5. As can be seen from FIG. 5, when the count is zero ("0000") the further phase shift 50 is driven such that it produces a phase shift of $$\Delta\phi = \tfrac{1}{2} * t_{Bit}$$

For counts that are greater than zero, the phase shift Δϕ which is produced by the further phase shifter 50 is reduced. For example, a count of 2 (digital value "0010") results in a phase shift of only $$\Delta\phi = (\tfrac{1}{2} - \tfrac{2}{16}) * t_{Bit}$$

Negative counts, for example a count of −1, are taken into account by allowing the counter to overflow. A count of −1 thus corresponds to a count of 15 in the case of a four-bit counter, thus forming a digital number "1111" as the count. A count such as this indicates to the further phase shifter 50 that a phase shift of $$\Delta\phi = (\tfrac{1}{2} + \tfrac{1}{16}) * t_{Bit}$$

should be set.

The other negative counts are reached by counting backwards, as can be seen in the table in FIG. 5. By way of example, a count of −2 ("1110") indicates to the further phase shifter 50 that a phase shift of $$\Delta\phi = (\tfrac{1}{2} + \tfrac{2}{16}) * t_{Bit}$$

should be produced.

In order now to ensure that no sudden phase change occurs when the digital value changes from "1000" to "1001" or from "1001" to "1000", the respective phase value Δϕ is stored and frozen when the count increases from "8" or decreases from "9". Thus, if the phase range which can be set by means of the further phase shifter 50 is exceeded or undershot, the latch module 220 then ensures that the maximum phase shift value $$\Delta\phi=(1/2+7/16)*t_{Bit}$$

or the minimum phase shift value $$\Delta\phi=(1/2-8/16)*t_{Bit}$$

is maintained.

The latch module 220 may be equipped with an internal or external processor for this purpose.

In order to ensure that the circuit as shown in FIGS. 1 and 2 operates without any disturbances, the counter length of the step-up and step-down counter 240, the bit length of the latch module 220 and the resolution of the phase shifter 50 are matched to one another, in terms of the number of bits; this means that these components preferably operate with the same bit length.

Finally, it should be mentioned that the control response times of the duty cycle correction device can be set via the counter lengths of the signal edge counter 200 and of the step-up and step-down counter 240 as well as by means of the clock frequency $f_{clk}$ of the clock signal Clk from the clock generator 230.

LIST OF SYMBOLS

10 Circuit for correction of the duty cycle value of a data signal
20 Duty cycle correction device
30 Duty cycle detector
40 Phase shifter
50 Controllable phase shifter
60 Rising edge detector
70 RS latch module
80 Falling edge detector
90/100 Buffer elements
200 Signal edge counter
210 Digital integrator
220 Latch module
230 Clock generator
240 Step-up and step-down counter
250 Edge counter
260 Gate generator
270 Digital averaging circuit
A Output signal from the phase shifter 40
B Output signal from the controllable phase shifter 50
A' Output signal from the rising edge detector 60
B' Output signal from the falling edge detector
Data Output Corrected data signal
G Trigger signal G from the signal edge counter 200
Clk Clock signal from the clock generator 230
Count C Count of the step-up and step-down counter 240
L Digital control signal at the output of the latch module 220

The invention claimed is:

1. A circuit for correction of the duty cycle value of a digital data signal, comprising:

a duty cycle correction device which has the data signal coupled to a signal input, and operable to correct the duty cycle value of the data signal as a function of a digital control signal which is applied to a control input of the duty cycle correction device, and output a corrected data signal at a signal output; and a digital duty cycle detector connected between the signal output and the control input of the duty cycle correction device, and operable to determine the actual duty cycle value of the corrected data signal and produce the digital control signal for the duty cycle correction device such that a discrepancy between the actual duty cycle value and a predetermined duty cycle value is a minimum, wherein the duty cycle detector comprises:

a digital integrator for forming the digital control signal; and a digital averaging circuit operable to determine a time at which an output signal of the digital integrator is used to form and update the digital control signal, and comprising a signal edge counter that counts the signal edges of the corrected data signal and triggers a production of the digital control signal as a function of its count with a trigger signal.

2. The circuit as claimed in claim 1, wherein the signal edge counter is configured to trigger the production of the digital control signal whenever it has once again counted a predetermined number of signal edges that have occurred after a respective previous triggering.

3. The circuit as claimed in claim 2, wherein the digital averaging circuit comprises a latch module, having an input connected to an output of the digital integrator and operable to pass the output signal from the digital integrator as a control signal to the duty cycle correction device when the trigger signal from the signal edge counter is applied to a control connection associated therewith.

4. A circuit for correction of the duty cycle value of a digital data signal, comprising:

a duty cycle correction device which has the data signal coupled to a signal input, and operable to correct the duty cycle value of the data signal as a function of a digital control signal which is applied to a control input of the duty cycle correction device, and output a corrected data signal at a signal output; and a digital duty cycle detector connected between the signal output and the control input of the duty cycle correction device, and operable to determine the actual duty cycle value of the corrected data signal and produce the digital control signal for the duty cycle correction device such that a discrepancy between the actual duty cycle value and a predetermined duty cycle value is a minimum, wherein the duty cycle detector comprises a digital integrator for forming the digital control signal;

wherein the digital integrator comprises a clock generator and a step-up and step-down counter connected to the clock generator, wherein the step-up and step-down counter counts up or down when the corrected data signal is at a "high" level, and counts in the opposite direction, that is to say it counts down or up, when the corrected data signal is at a "low" level;

wherein the step-up and step-down counter has an output connected to a digital averaging circuit that determines a time at which the respective output signal from the digital integrator is used to form and update the digital control signal;

wherein the output of the step-up and step-down counter is connected to an input of a latch module associated with the digital averaging circuit, wherein the latch module receives a respective count from the step-up and step-down counter, updates the digital control signal, and outputs the digital control signal when a trigger signal is applied to a control connection associated therewith; and wherein the control connection of the latch module is connected to an output of a signal edge counter associated with the digital averaging circuit, wherein the signal edge counter counts the signal edges of the corrected data signal and triggers a production of the digital control signal as a function of its count using the trigger signal.

5. The circuit as claimed in claim 4, wherein the latch module receives the respective count of the step-up and step-down counter when the trigger signal from the signal edge counter is applied to its control connection.

6. The circuit as claimed in claim 6, wherein the output of the latch module forms an output of the duty cycle detector, and is connected to the digital control input of the duty cycle correction device.

7. The circuit as claimed in claim 4, further comprising a gate generator connected between the control connection of the latch module and the output of the signal edge counter, and operable to produce a defined pulse for the latch module when the signal edge counter reaches a predetermined count.

8. The circuit as claimed in claim 1, wherein the duty cycle correction device comprises a falling edge detector and a rising edge detector, whose output signals are used to form the corrected data signal.

9. The circuit as claimed in claim 8, wherein the rising edge detector and the falling edge detector are each preceded by a phase shifter, to whose input the data signal is applied.

10. The circuit as claimed in claim 9, wherein one of the two phase shifters is driven by a control connection, and the control connection of the phase shifter comprises the digital control input of the duty cycle correction device.

11. The circuit as claimed in claim 10, wherein the phase shifter, which is driven by the control connection, is connected upstream of the falling edge detector.

12. The circuit as claimed in claim 11, further comprising an RS latch module having an input connected to the output of the rising edge detector and another input connected to the output of the falling edge detector, and having an output, wherein an output signal associated therewith forms the corrected data signal.

13. The circuit as claimed in claim 12, further comprising one or more buffer modules connected to the output of the RS latch module, through which the corrected data signal is passed before it is emitted at the output of the duty cycle correction device.

14. A method for duty cycle correction for a digital data signal, comprising:

forming two auxiliary signals from the data signal with a predetermined phase shift with respect to one another; and correcting a duty cycle value of the data signal using the two auxiliary signals, wherein the correcting comprises:

determining a discrepancy between a duty cycle value of the corrected data signal and a preset value using a duty cycle detector; and setting the phase shift between the auxiliary signals such that the discrepancy between the duty cycle value and the preset value is a minimum, wherein the discrepancy determination of the duty cycle detector is carried out using digital integration and comprises the steps of counting a predetermined number of signal edges of the corrected data signal with a signal edge counter for the purposes of averaging the duty cycle value of the corrected data signal and resetting the phase shift between the auxiliary signals when a predetermined number of signal edges have been counted once again after a respective previous setting of the phase shift.

15. The method as claimed in claim 14, wherein counting the signal edges further comprises:

counting clock signal transitions from a clock generator using a step-up and step-down counter, with the count of the step-up and step-down counter being counted up or down when the corrected data signal is at a “high” level, and being counted down or up in the opposite direction when the corrected data signal is at a “low” level; and using the respective count of the step-up and step-down counter as a control signal for setting the phase shift between the two auxiliary signals.

16. The method as claimed in claim 15, further comprising resetting the phase shift between the auxiliary signals using the respective count of the step-up and step-down counter as soon as a predetermined number of signal edges have been counted once again by the signal edge counter after their respective previous setting of the phase shift.

* * * * *